(12) United States Patent
Lam et al.

(10) Patent No.: US 8,098,087 B1
(45) Date of Patent: Jan. 17, 2012

(54) METHOD AND APPARATUS FOR STANDBY VOLTAGE OFFSET CANCELLATION

(75) Inventors: John Dung-Ngoc Lam, San Jose, CA (US); Arch Zaliznyak, San Jose, CA (US); Wilson Wong, San Francisco, CA (US); Tin H. Lai, San Jose, CA (US); Chong H. Lee, San Ramon, CA (US); Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 1325 days.

(21) Appl. No.: 11/682,282

(22) Filed: Mar. 5, 2007

(51) Int. Cl.
*H03K 5/08* (2006.01)

(52) U.S. Cl. ............. 327/307; 327/362; 327/363; 330/9

(58) Field of Classification Search .................. 327/307, 327/362–363; 330/9
See application file for complete search history.

(56) References Cited

U.S. PATENT DOCUMENTS

| | | | | |
|---|---|---|---|---|
| 5,061,900 A * | 10/1991 | Vinn et al. | ......................... | 330/9 |
| 5,821,795 A * | 10/1998 | Yasuda et al. | ................. | 327/307 |
| 6,515,464 B1 * | 2/2003 | Darmawaskita et al. | .. | 324/76.11 |
| 6,710,645 B2 * | 3/2004 | Isken et al. | ......................... | 330/9 |
| 6,724,248 B2 * | 4/2004 | Llewellyn | ......................... | 330/9 |
| 7,075,465 B2 * | 7/2006 | Jonsson et al. | ................. | 341/120 |
| 7,095,275 B2 * | 8/2006 | Miyazaki | ......................... | 330/9 |
| 7,196,552 B2 * | 3/2007 | Zhou | ............................... | 327/65 |
| 7,589,650 B2 * | 9/2009 | Hsien et al. | .................... | 341/118 |
| 7,728,632 B1 * | 6/2010 | Bi | ..................................... | 327/65 |
| 7,755,421 B2 * | 7/2010 | Chen et al. | ......................... | 330/9 |
| 2006/0077003 A1 * | 4/2006 | Chiu et al. | ......................... | 330/9 |
| 2006/0186954 A1 * | 8/2006 | Koller et al. | ....................... | 330/9 |

* cited by examiner

*Primary Examiner* — Kenneth B. Wells
(74) *Attorney, Agent, or Firm* — Womble Carlyle Sandridge & Rice, LLP

(57) ABSTRACT

A method and apparatus is provided for standby voltage offset cancellation at inputs to a comparator within a receiver channel. Each of a first comparator input and second comparator input is isolated from an input signal such that each of the first and second comparator inputs attains a respective standby voltage level. A voltage level on one of the first and second comparator inputs is incrementally changed, while the output signal of the comparator is monitored. Upon detecting a state transition in the output signal of the comparator, the incremental changing of the voltage level on the one comparator input is stopped at a final voltage level setting. The final voltage level setting is stored in a computer memory for reference in setting of the voltage level at the one comparator input so as to compensate for the standby voltage offset at the inputs to the comparator.

18 Claims, 6 Drawing Sheets

METHOD AND APPARATUS FOR STANDBY VOLTAGE OFFSET CANCELLATION

BACKGROUND

As semiconductor devices continue to migrate toward smaller and smaller technologies, device features that are supposed to be identical are more likely to exhibit on-chip variation (OCV). The OCV in device features can manifest as unexpected and undesirable variation in electrical performance. For example, two transistors that are supposed to be identical may have an associated OCV that manifests itself as different threshold voltages for the two transistors. To ensure proper interfacing between devices in the presence of OCV, it may be necessary to electrically characterize the particular as-fabricated instance of each device. To this end, solutions are needed to enable efficient and accurate electrical performance characterization/compensation for components within each instance of a given device.

SUMMARY

In one embodiment, a method is disclosed for standby voltage offset cancellation at inputs to a comparator within a receiver channel. The method includes isolating each of a first comparator input and second comparator input from an input signal, such that each of the first and second comparator inputs attains a respective standby voltage level. Then, the voltage level on one of the first or second comparator inputs is incrementally changed while monitoring an output signal of the comparator. Upon detecting a state transition in the output signal of the comparator, the incremental changing of the voltage level on the one comparator input is stopped. The voltage applied at the one comparator input when the state transition occurs in the comparator output signal represents a final voltage level setting. The final voltage level setting is stored in a computer memory.

In another embodiment, a method is disclosed for programming a standby voltage offset cancellation setting at inputs to a comparator within a receiver channel. A voltage level at one of a first comparator input or a second comparator input is set to a voltage level at an end of a linear voltage adjustment range. Then, the voltage level at the one comparator input is changed to a next voltage setting within the linear voltage adjustment range. If a state transition in an output signal of the comparator is detected as a result of changing the voltage level at the one comparator input, an operation is performed to store the voltage level setting at the one comparator input in a computer memory. If the state transition in the comparator output signal is not detected, an operation is performed to repeat changing of the voltage level at the one comparator input to the next voltage setting within the linear voltage adjustment range, and again querying as to whether or not the state transition has occurred in the comparator output signal.

In another embodiment, a module is disclosed for determining and programming a standby voltage offset cancellation setting at inputs to a comparator within a receiver channel. The module includes circuitry defined to isolate each of a first comparator input and second comparator input from an input signal, such that each of the first and second comparator inputs is capable of attaining a respective standby voltage level. A programmable variable current source is connected to one of the first and second comparator inputs. The module also includes circuitry defined to program the variable current source so as to incrementally change a voltage level on the one comparator input to which the variable current source is connected. The module further includes circuitry defined to stop the incremental changing of the voltage level on the one comparator input at a final voltage level setting upon detecting a state transition in an output signal of the comparator. Additionally, the module includes circuitry defined to store the final voltage level setting in a computer memory.

In another embodiment, a programmable logic device (PLD) is disclosed. The PLD includes a voltage offset cancellation block defined to determine a standby voltage offset present at inputs of a comparator within a receiver channel. The voltage offset cancellation block is also defined to dynamically program a voltage setting to be applied at one of the inputs of the comparator so as to sufficiently cancel the standby voltage offset.

Other aspects and advantages of the invention will become more apparent from the following detailed description, taken in conjunction with the accompanying drawings, illustrating by way of example the present invention.

DETAILED DESCRIPTION

Figure 1A:
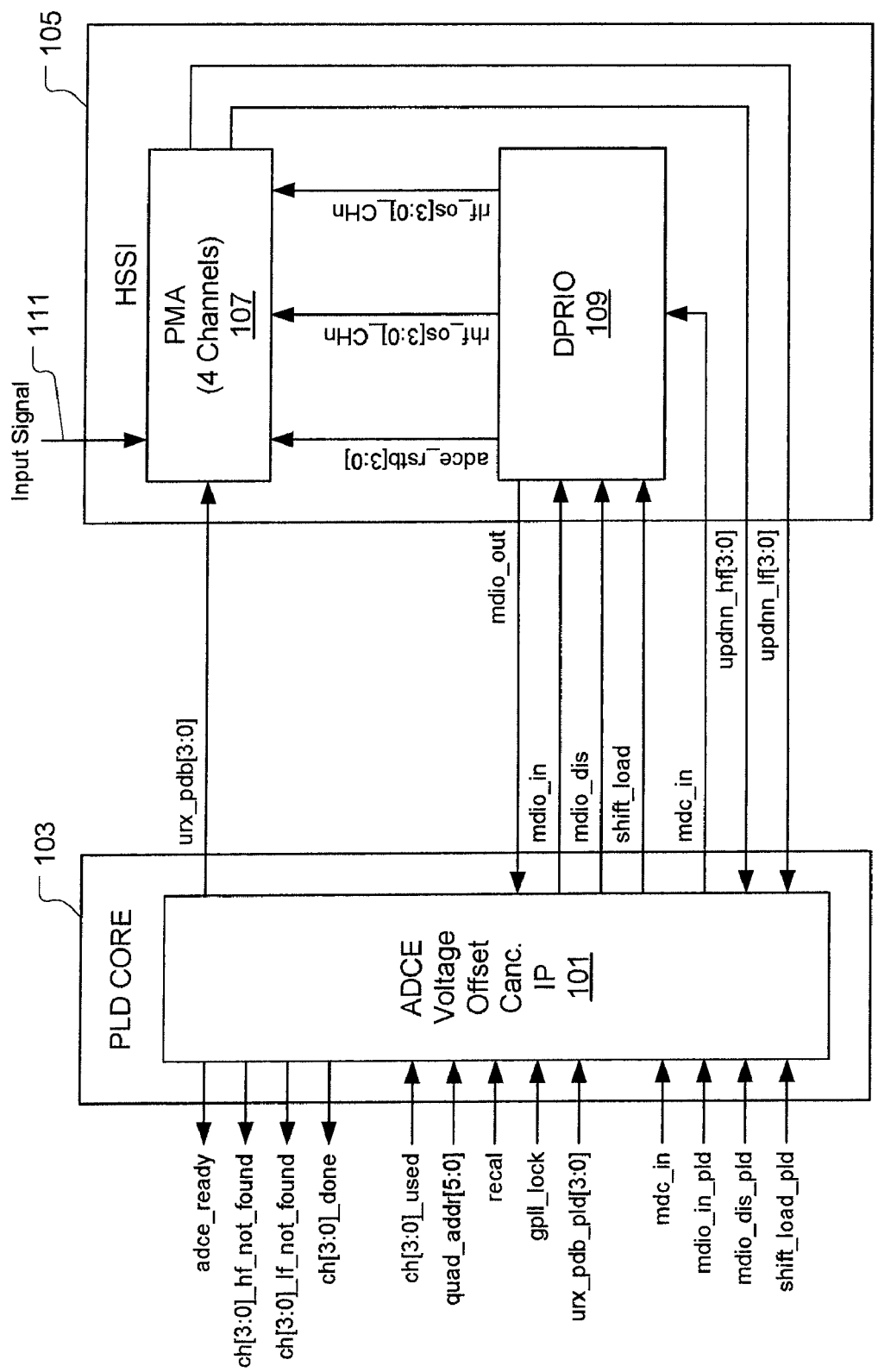
FIG. 1A is an illustration showing a block-level diagram of the programmable ADCE voltage offset cancellation IP within the Stratix-II GX architecture, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

By way of example, the present invention is described herein within the context of the Stratix-II GX field programmable gate array (FPGA) device as provided by Altera Corporation. However, it should be appreciated that the principles of the present invention can be applied within contexts other than the Stratix-II GX FPGA. Therefore, although in one embodiment the present invention is implemented within the Stratix-II GX FPGA, it should be understood that in other embodiments the present invention can be implemented outside the context of the Stratix-II GX FPGA.

The Stratix-II GX FPGA can be put on many different PCBs. It is not feasible to predict the trace characteristics that will occur on the different PCBs. Thus, it is not possible to set an impedance of the receiver (RX) input buffer to a single value that will match all possible trace impedances to which the RX input buffer may interface. Within the Stratix-II GX FPGA, an Adaptive Dispersion Compensation Engine (ADCE) is provided to tune the impedance of the RX input buffer to match with the impedance of the particular PCB trace to which the RX input buffer interfaces. Within the Stratix-II GX FPGA, the ADCE resides in the Physical Medium Attachment (PMA) portion of the High-Speed Serial Interface (HSSI), along with the RX input buffer, equalization stages, and other circuitry.

The ADCE monitors the output of the RX input buffer and adaptively adjusts the equalization level to give the best performance for an arbitrary backplane, i.e., for an arbitrary PCB. As a result, the ADCE relieves the customer from manually finding the right equalization setting. Within the Stratix-II GX FPGA, the RX equalization acts as a high frequency amplifier while allowing low frequency signals to pass through unattenuated. Thus, the RX equalization enables the RX to rebuild the signal and interpret it successfully.

To match the impedance of the RX input buffer, the ADCE includes a low frequency (LF) loop and a high frequency (HF) loop. The LF loop adjusts the amplitude of the input signal. The HF loop adjusts the rise and fall rate of the input signal. Upon power up, the ADCE is released from reset. First, the low frequency content of the signal output from the RX input buffer is adjusted via the LF loop. The LF loop adjusts the DC amplitude of the reference edge to match the DC amplitude of the incoming equalized signal edge. Next, the HF loop adjusts the edge rate of the incoming equalized signal to match the reference edge rate.

The LF loop of the ADCE circuit includes a LF comparator which receives a pair of input signals and generates an output signal "updnn_lf." Similarly, the HF loop of the ADCE includes a HF comparator which receives a pair of input signals and generates an output signal "updnn_hf." An asserted LF comparator output signal, e.g., updnn_hf=1, causes an increase in the output amplitude of the reference signal. An asserted HF comparator output, e.g., updnn_hf=1, causes an increase in equalization.

The inputs of the LF and HF comparators within the ADCE are subject to on-chip variation (OCV) induced voltage offset. The OCV can manifest itself through transistors that are supposed to be identical, but actually have different as-fabricated characteristics, e.g., different threshold voltages. The OCV can be quite pronounced at 90 nm and smaller technology nodes. If not cancelled, the OCV can induce a voltage offset at the inputs of the ADCE LF and HF comparators, respectively, and severely impair the ADCE functionality. In the presence of an OCV-induced voltage offset at the LF comparator inputs, the LF comparator behavior becomes erroneous and the LF comparator output signal (updnn_lf) becomes unreliable. Similarly, if an OCV-induced voltage offset exists at the HF comparator inputs, the HF comparator behavior becomes erroneous and the HF comparator output signal (updnn_hf) becomes unreliable. Therefore, when the OCV-induced voltage offset at the LF and HF comparator inputs becomes greater than the design limit, e.g., maximum 2 mV, a reliable and consistent mechanism is needed to adequately compensate for the OCV-induced voltage offset at the LF and HF comparator inputs.

A mechanism is disclosed herein for automatically determining and programming an appropriate voltage offset compensation setting for the inputs of the LF and HF comparators in the ADCE. In one embodiment, the voltage offset compensation mechanism is implemented as ADCE voltage offset cancellation intellectual property (IP) within the Stratix-II GX FPGA. The ADCE voltage offset cancellation IP represents a programmable module that can be put inside the Stratix-II GX FPGA core and that can interface with the ADCE circuit within the PMA portion of the HSSI. Thus, the ADCE voltage offset cancellation IP defines a digital circuit that uses the dynamic re-configurability feature of the Stratix-II GX FPGA to compensate for the OCV-induced voltage offset at the inputs of the LF and HF comparators so as to ensure correct and reliable operation of the ADCE circuitry.

FIG. 1A is an illustration showing a block-level diagram of the programmable ADCE voltage offset cancellation IP 101 within the Stratix-II GX architecture, in accordance with one embodiment of the present invention. For ease of description, the ADCE voltage offset cancellation IP 101 will hereafter be referred to as the IP 101. The IP 101 resides within the programmable logic device (PLD) core 103. The IP 101 is designed to interface with the HSSI 105. Within the Stratix-II GX, the ADCE resides in the PMA 107 within the HSSI 105. The RX input buffer, LF comparator, and HF comparator also reside in the PMA 107. The IP 101 is defined to interface with the PMA 107 and the Dynamic Partial Reconfigurable Input/Output (DPRIO) 109 within the HSSI 105. The DPRIO 109 serves as the configuration mechanism for setting configuration parameters within the PMA 107. With respect to the IP 101, the DPRIO 109 enables setting of the voltage offset configuration parameters to be applied at the inputs of the LF and HF comparator associated with each receiver in the PMA 107.

In the Stratix-II GX embodiment, the HSSI 105 includes four channels, wherein each channel includes a respective receiver (RX) channel and a respective transmitter (TX) channel. Thus, the HSSI 105 includes four (4) RX channels, each capable of receiving a separate input signal as indicated by arrow 111. The IP 101 is defined to enable voltage offset cancellation at the inputs of the LF and HF comparators on a channel-by-channel basis. Therefore, the voltage offset cancellation settings to be applied at the inputs of the LF and HF comparators of each RX channel can be independently programmed. The IP 101 is defined to communicate with the DPRIO 109 through a number of signals, including "mdio_in," "mdio_out," "mdio_dis," and "shift_load." The "mdio_in" signal represents data communicated to the DPRIO 109 from the IP 101. The "mdio_out" signal represents data communicated from the DPRIO 109 to the IP 101. The "mdio_dis" signal represents a control signal from either the IP 101 or the PLD core to disable the DPRIO 109. The "shift_load" signal represents a control signal from the IP 101 or the PLD core to enable either the serial shifting of data into the DPRIO 109, or the parallel loading of the data from the DPRIO 109 to the HSSI 105. Additionally, the "mdc_in" signal represents a clock signal, in accordance with which the IP 101 and DPRIO 109 operate.

When the IP 101 is disengaged, i.e., idle, the "mdio_in," "mdio_out," "mdio_dis," and "shift_load" signals corresponds to a "mdio_in_pld," "mdio_out_pld," "mdio_dis_pld," and "shift_load_pld" signals, respectively, as received by the PLD core 103 outside the IP 101. When the IP 101 is engaged, the IP 101 functions to hijack the "mdio_in," "mdio_out," "mdio_dis," and "shift_load" signals for use in communicating with the DPRIO 109 to program the voltage offset cancellation settings to be applied at the inputs of the LF and HF comparators of each RX channel.

A RX input buffer power down signal "urx_pdb[3:0]" is communicated from the IP 101 to the PMA 107. When asserted, the "urx_pdb[3:0]" causes the RX input buffer for the channel indicated by bits [3:0] therein to be powered down. Because the voltage level at the input terminals of each of the LF and HF comparators should be the same when the RX input buffer is in a powered down state, it is necessary to power down the RX input buffer to determine the appropriate voltage offset to be applied to the inputs of the LF and HF comparators. When the IP 101 is engaged, the "urx_pdb[3:0]" signal is controlled by the IP 101. When the IP 101 is disengaged, the "urx_pdb[3:0]" signal corresponds to a "urx_pdb_pld[3:0]" signal received by the PLD core 103 outside the IP 101.

The LP 101 is defined to receive a number of signals to be utilized in performing its functions with regard to determining and programming the appropriate voltage offset cancellation parameter settings to be applied at the inputs of the LF and HF comparators within the PMA 107. The IP 101 receives a "ch[3:0]_used" signal to identify the channel to be processed, wherein the channel is identified by bits [3:0] therein. The IP 101 receives a "quad_addr[5:0]" to identify the quad where offset cancellation is supposed to happen (in case the IP 101 controls multiple quads, where a quad consists of 4 RX channels, 4 TX channels, and a DPRIO 109 block. The IP 101 receives a "recal" signal which, when asserted, triggers a recalibration of the voltage offset cancellation parameter settings to be applied at the inputs of the LF and HF comparators within the PMA 107. The IP 101 also receives a "gpll_lock" signal which, when asserted, indicates that the phase lock loop (PLL) has attained lock at power up of the PLD core 103. Upon receiving the asserted "gpll_lock" signal at power up of the PLD core 103, the IP 101 is engaged to calibrate the voltage offset cancellation parameter settings to be applied at the inputs of the LF and HF comparators within the PMA 107.

The IP 101 is also defined to provide a number of signals representing the status and results of the process for determining and programming the appropriate voltage offset cancellation parameter settings to be applied at the inputs of the LF and HF comparators within the PMA 107. The IP 101 provides the "adce_ready" signal which, when asserted, indicates completion of the process for determining and programming the appropriate voltage offset cancellation parameter settings to be applied at the inputs of the LF and HF comparators within the PMA 107. The IP 101 also provides the "ch[3:0]_done" signal which, when asserted, indicates completion of the process for determining and programming the appropriate voltage offset cancellation parameter settings to be applied at the inputs of the LF and HF comparators for the channel indicated by bits [3:0] therein.

The IP 101 also provides the "ch[3:0]_lf_not_found" signal which, when asserted, indicates that a voltage offset cancellation setting could not be identified for the LF comparator inputs associated with the channel indicated by bits [3:0] therein. The IP 101 further provides the "ch[3:0]_hf_not_found" signal which, when asserted, indicates that a voltage offset cancellation setting could not be identified for the HF comparator inputs associated with the channel indicated by bits [3:0] therein. If compensation cannot be made for the OCV-induced voltage offset on a particular channel, the "ch[3:0]_hf_not_found" and "ch[3:0]_lf_not_found" signals are used to inform the user. The user can then decide to proceed with or discontinue use of the RX having the uncompensated voltage offset issues.

The IP 101 is also defined to receive the output signal provided by each LF comparator and HF comparator within the PMA 107. The "updnn_[3:0]" signal represents the output of the LF comparator associated with the RX for the channel indicated by bits [3:0] therein. The "updnn_hf[3:0]" signal represents the output of the HF comparator associated with the RX for the channel indicated by bits [3:0] therein.

The DPRIO 109 provides the configuration mechanism through which the voltage present at the inputs to the LF and HF comparators can be set. The "rlf_os[3:0]_CHn" signal communicated from the DPRIO 109 to the PMA 107 is used to set the voltage at the input of the LF comparator connected to the RX input buffer of the channel that is indicated by bits [3:0] therein. The "rhf_os[3:0]_CHn" signal communicated from the DPRIO 109 to the PMA 107 is used to set the voltage at the input of the HF comparator connected to the RX input buffer of the channel that is indicated by bits [3:0] therein. The "adce_rstb[3:0]" signal communicated from the DPRIO 109 to the PMA 107 is used to place the ADCE block of the channel indicated by bits [3:0] therein in a reset state.

Figure 1B:
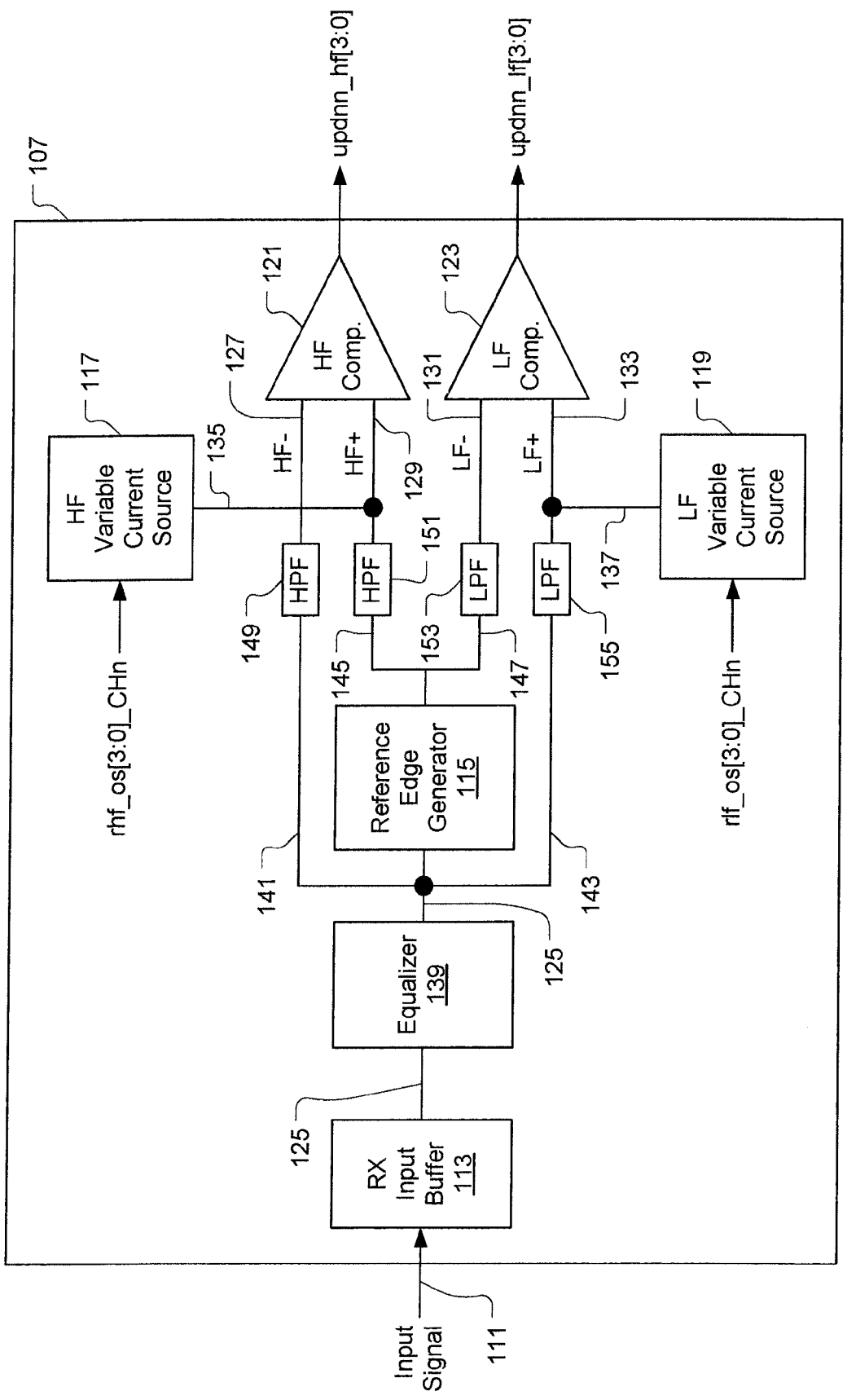
FIG. 1B is an illustration showing one of the four RX channels within the PMA, in accordance with one embodiment of the present invention.

FIG. 1B is an illustration showing one of the four RX channels within the PMA 107, in accordance with one embodiment of the present invention. The input signal 111 is received at the RX input buffer 113. The RX input buffer 113 drives a clean version of the input signal 111 through a connection 125 to an equalizer 139. The equalizer 139 boosts the high frequency components of the input signal 111, while allowing low frequency components of the input signal 111 to pass through unattenuated. The output signal from the equalizer 139 is transmitted to a reference edge generator 115, as indicated by a connection 125. The reference edge generator 115 generates an ideal reference edge to compare against the output of the equalizer 139.

The output signal from the equalizer 139 is transmitted to a high-pass filter (HPF), as indicated by a connection 141. Also, the output signal from the equalizer 139 is transmitted to a low-pass filter (LPF) 155, as indicated by a connection 143. The output signal from the reference edge generator 115 is transmitted to a HPF 151, as indicated by a connection 145. Also, the output signal from the reference edge generator 115 is transmitted to a LPF 153, as indicated by a connection 147. The output of the HPF 149 is transmitted as a first input to the HF comparator 121, as indicated by a connection HF– 127. The output of the HPF 151 is transmitted as a second input to the HF comparator 121, as indicated by a connection HF+ 129. The output of the LPF 153 is transmitted as a first input to the LF comparator 123, as indicated by a connection LF– 131. The output of the LPF 155 is transmitted as a second input to the LF comparator 123, as indicated by a connection LF+ 133.

The HF comparator 121 compares the energy of the high frequency components within the signals output from the equalizer 139 and the reference edge generator 115. Similarly, the LF comparator 123 compares the energy of the low frequency components within the signals output from the equalizer 139 and the reference edge generator 115. An output of the HF comparator 121 is provided as the "updnn_hf[3:0]" signal previously introduced. An output of the LF comparator 123 is provided as the "updnn_lf[3:0]" signal previously introduced.

When the RX input buffer 113 is powered down, there are no signals present at the inputs to the HF and LF comparators 121 and 123. Ideally, when the RX input buffer 113 is powered down, there should be essentially zero voltage differential between the HF+ 129 and HF– 127 connections. Similarly, when the RX input buffer 113 is powered down, there should be essentially zero voltage differential between the LF+ 133 and LF– 131 connections. "Essentially zero voltage differential" as used above means that the voltage differential present should be less than the maximum voltage differential allowed by the design specification.

When the RX input buffer 113 is powered down, an OCV-induced voltage offset may be present between the HF+ 129 and HF– 127 connections, i.e., between the inputs of the HF comparator 121. Similarly, when the RX input buffer 113 is powered down, an OCV-induced voltage offset may be present between the LF+ 133 and LF– 131 connections, i.e., between the inputs of the LF comparator 123. Thus, in the absence of appropriate voltage offset compensation, the outputs "updnn_hf[3:0]" and "updnn_lf[3:0]" may be biased.

A LF variable current source 119 is provided to compensate for the voltage offset preset at the inputs of the LF comparator 123. Through connection 137, the LF variable current source 119 is capable of influencing the voltage present at the LF+ 133 connection. It should be understood, however, that the LF variable current source 119 can be connected to either the LF+ 133 or LF− 131 connection. The LF variable current source 119 is capable of controlling the voltage on the LF+ 133 connection in discrete voltage increments based on the control signal "rlf_os[3:0]_CHn" provided by the DPRIO 109. It should be appreciated that in various embodiments the voltage incrementing capability of the LF variable current source 119 can vary. In one embodiment, the LF variable current source 119 is capable of varying the voltage present at the LF+ 133 connection from −70 mV to +70 mV in increments of 10 mV. With the RX input buffer 113 powered down, the OCV-induced voltage offset present between the LF+ 133 and LF− 131 connections can be determined and compensated by appropriately setting the LF variable current source 119 control signal "rlf_os[3:0]_CHn." The IP 101 is defined to enable automatic determination and setting of the appropriate "rlf_os[3:0]_CHn" control signal.

A HF variable current source 117 is provided to compensate for the voltage offset present at the inputs of the HF comparator 121. Through connection 135, the HF variable current source 117 is capable of influencing the voltage present at the HF+ 129 connection. It should be understood, however, that the HF variable current source 117 can be connected to either the HF+ 129 or HF− 127 connection. The HF variable current source 117 is capable of controlling the voltage on the HF+ 129 connection in discrete voltage increments based on the control signal "rhf_os[3:0]_CHn" provided by the DPRIO 109. It should be appreciated that in various embodiments the voltage incrementing capability of the HF variable current source 117 can vary. In one embodiment, the HF variable current source 117 is capable of varying the voltage present at the HF+ 129 connection from −70 mV to +70 mV in increments of 10 mV. With the RX input buffer 113 powered down, the OCV-induced voltage offset present between the HF+ 129 and HF− 127 connections can be determined and compensated by appropriately setting the HF variable current source 117 control signal "rhf_os[3:0]_CHn." The IP 101 is defined to enable automatic determination and setting of the appropriate "rhf_os[3:0]_CHn" control signal.

As discussed in further detail below, the IP 101 provides a mechanism through which the OCV-induced voltage offset present at the inputs to the LF and HF comparators of a RX channel can be compensated by programming the appropriate DPRIO bits. More specifically, the IP 101 enables the pre-placed programmable current sources on one of the two inputs of a particular comparator to be adjusted, thus changing the voltage level present at the comparator input. The voltage adjustment capability of each programmable current source is defined by a number of pre-defined DPRIO bit settings. The settings correspond to particular values of the change in a voltage level at the corresponding comparator input relative to the default setting of 0 V.

Figure 2:
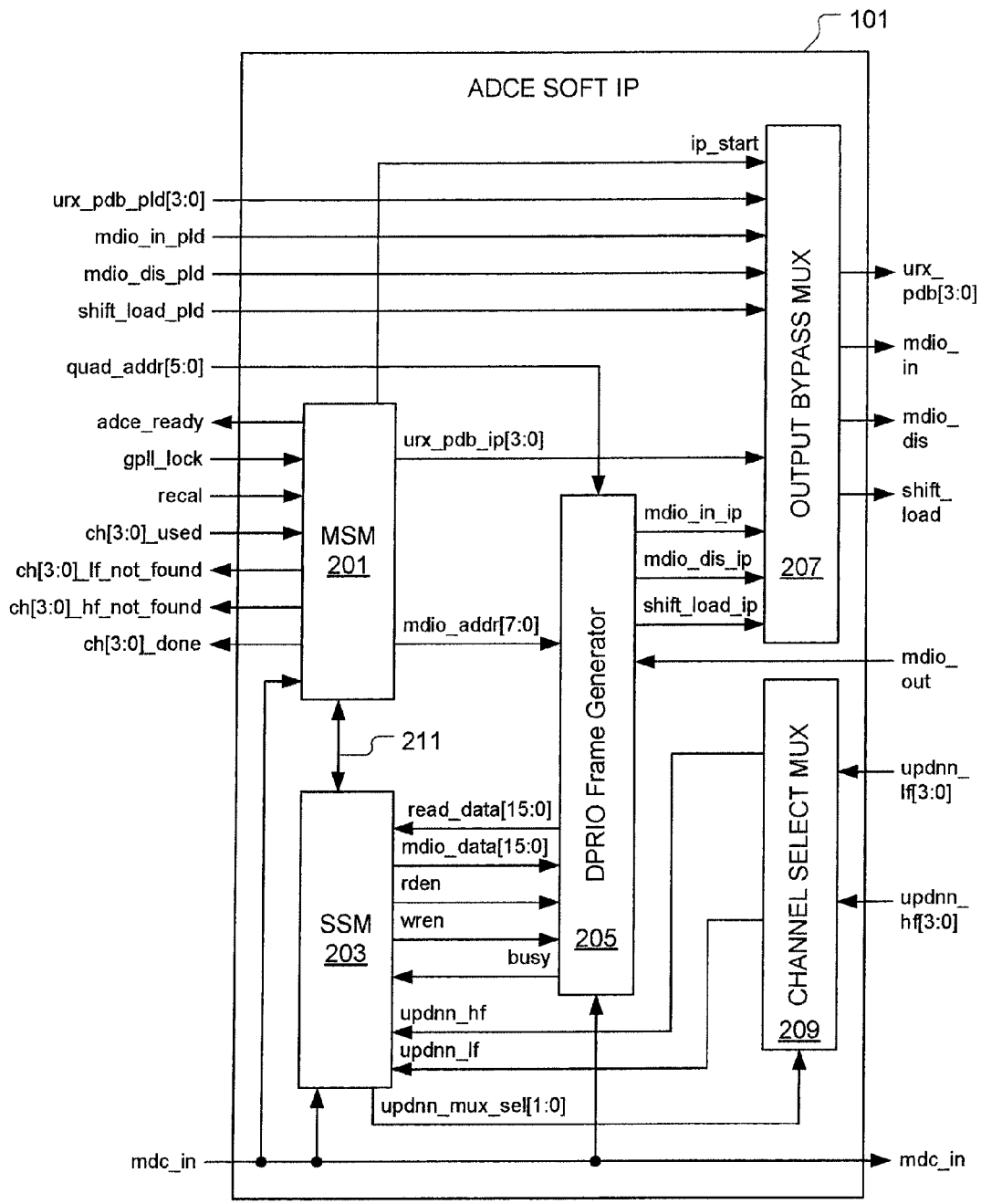
FIG. 2 is an illustration showing the ADCE voltage offset cancellation IP, in accordance with one embodiment of the present invention.

FIG. 2 is an illustration showing the ADCE voltage offset cancellation IP 101, in accordance with one embodiment of the present invention. The IP 101 includes a Master State Machine (MSM) 201, a Search State Machine (SSM) 203, a DPRIO frame generator 205, a channel select multiplexer (mux) 209, and an output bypass mux 207. Each of the input and output signals associated with the IP 101, as introduced in FIG. 1A, are also depicted in FIG. 2. Each of the MSM 201, SSM 203, and DPRIO frame generator 205 circuitry is defined to operate in accordance with the "mdio_in" clock signal.

The signals "urx_pdb_pld[3:0]," "mdio_in_pld," "mdio_dis_pld," and "shift_load_pld" are transmitted as inputs to the output bypass muxes 207. The output bypass mux 207 provides a mechanism for hijacking the "urx_pdb_pld[3:0]," "mdio_in_pld," "mdio_dis_pld," and "shift_load_pld" signals. An "ip_start" signal is transmitted from the MSM 201 to the output bypass mux 107 to serve as the mux select signal. When the IP 101 is engaged, the "ip_start" signal is asserted, and the "urx_pdb_pld[3:0]," "mdio_in_pld," "mdio_dis_pld," and "shift_load_pld" signals are hijacked by the output bypass mux 207. When the IP 101 is disengaged, the "ip_start" signal is not asserted, and the "urx_pdb_pld[3:0]," "mdio_in_pld," "mdio_dis_pld," and "shift_load_pld" signals pass through the output bypass mux 207 as if the IP 101 were not present.

The output bypass mux 207 receives an input signal "urx_pdb_ip[3:0]" from the MSM 201. The "urx_pdb_ip[3: 0]" signal is used to power down the RX input buffer in the PMA 107 in order to perform the ADCE voltage offset cancellation process. Within the output bypass mux 207, the "urx_pdb_ip[3:0]" signal is muxed with the "urx_pdb_pld[3: 0]" signal to generate the "urx_pdb[3:0]" output signal. When the "ip_start" signal is asserted, the "urx_pdb_ip[3:0]" signal is transmitted from the IP 101 as the "urx_pdb[3:0]" output signal. When the "ip_start" signal is not asserted, the "urx_pdb_pld[3:0]" signal is transmitted from the IP 101 as the "urx_pdb[3:0]" output signal.

The output bypass mux 207 receives an input signal "mdio_in_ip" from the DPRIO frame generator 205. Within the output bypass mux 207, the "mdio_in_ip" signal is muxed with the "mdio_in_pld" signal to generate the "mdio_in" output signal. When the "ip_start" signal is asserted, the "mdio_in_ip" signal is transmitted from the IP 101 as the "mdio_in" output signal. When the "ip_start" signal is not asserted, the "mdio_in_pld" signal is transmitted from the IP 101 as the "mdio_in" output signal.

The output bypass mux 207 receives an input signal "mdio_dis_ip" from the DPRIO frame generator 205. Within the output bypass mux 207, the "mdio_dis_ip" signal is muxed with the "mdio_dis_pld" signal to generate the "mdio_dis" output signal. When the "ip_start" signal is asserted, the "mdio_dis_ip" signal is transmitted from the IP 101 as the "mdio_dis" output signal. When the "ip_start" signal is not asserted, the "mdio_dis_pld" signal is transmitted from the IP 101 as the "mdio_dis" output signal.

The output bypass mux 207 receives an input signal "shift_load_ip" from the DPRIO frame generator 205. Within the output bypass mux 207, the "shift_load_ip" signal is muxed with the "shift_load_pld" signal to generate the "shift_load" output signal. When the "ip_start" signal is asserted, the "shift_load_ip" signal is transmitted from the IP 101 as the "shift_load" output signal. When the "ip_start" signal is not asserted, the "shift_load_pld" signal is transmitted from the IP 101 as the "shift_load" output signal.

The channel select mux 209 is defined to enable selection between the four RX channels within the HSSI 105. The channel select mux 209 receives the LF comparator output signal "updnn_lf[3:0]" and the HF comparator output signal "updnn_hf[3:0]." In one embodiment, the "updnn_lf[3:0]" signal includes the LF comparator output for each of the four RX channels, wherein each channel is identified by a particular one of the bits [3:0]. Also, in one embodiment, the "updnn_hf[3:0]" signal includes the HF comparator output for each of the four RX channels, wherein each channel is identified by a particular one of the bits [3:0]. The channel select mux 209 receives a select signal "updnn_mux_sel[1:0]" from the SSM 203. The "updnn_mux_sel[1:0]" select signal is used to select which of the RX channels is to have their LF and HF comparator outputs passed to the SSM 203. Specifically, the channel select mux 209 functions to pass the LF comparator output signal "updnn_lf[3:0]" for the channel identified by the "updnn_mux_sel[1:0]" signal to the SSM 203 as the "updnn_hf" signal. Similarly, the channel select mux 209 functions to pass the HF comparator output signal "updnn_hf[3:0]" for the channel identified by the "updnn_mux_sel[1:0]" signal to the SSM 203 as the "updnn_hf" signal.

The MSM 201 is defined to handle the interface between the IP 101 and the outside world. For example, the MSM 201 monitors the "gpll_lock" signal so that when the "gpll_lock" signal is asserted, the IP 101 is activated. The MSM 201 also transmits the "adce_ready" signal, such that the "adce_ready" signal is asserted when the voltage offset cancellation process is completed, and not asserted otherwise. The MSM 201 also monitors the "recal" signal, such that when the "recal" signal is asserted, the voltage offset cancellation process is initiated. The MSM 201 is also responsible for generating the "ch[3:0]_lf_not_found" and "ch[3:0]_hf_not_found" signals. Operation of the MSM 201 is further described below with regard to FIGS. 3A-3B.

The MSM 201 is defined to communicate in a bi-directional manner with the SSM 203, as indicated by arrow 211. The SSM 203 is responsible for adjusting the voltage at the LF and HF comparator inputs by stepping through the voltage adjustment range. The SSM 203 directs the voltage adjustment at the LF and HF comparator inputs by communicating with the DPRIO frame generator 205 to enable setting of the appropriate DPRIO 109 bits. Also, when stepping through the voltage adjustment range of a given LF or HF comparator input, the SSM 203 is responsible for monitoring the "updnn_lf" and "updnn_hf" signals received from the channel select mux 209 to detect a transition of the LF and HF comparator output and stop the voltage adjustment accordingly.

The DPRIO frame generator 205 is defined to handle the interfacing with the DPRIO 109 registers. The DPRIO frame generator 205 ensures that the interface between the IP 101 and the DPRIO 109 is implemented in a seamless manner. In order to write new data to the DPRIO 109, some data may need to be first read from the DPRIO 109 in order to preserve it by writing it back to the DPRIO 109 along with the new data. Data to be written to the DPRIO 109 is communicated from the SSM 203 to the DPRIO frame generator 205 through the signal "mdio_data[15:0]." Data to be read from the DPRIO 109 is communicated to the SSM 203 from the DPRIO frame generator 205 through the signal "read_data[15:0]." Also, a read enable signal "rden" and a write enable signal "wren" are communicated from the SSM 203 to the DPRIO frame generator 205. Additionally, a "busy" signal is communicated from the DPRIO frame generator 205 to the SSM 203. It should be understood that the "read_data[15:0]," "mdio_data[15:0]," "rden," "wren," and "busy" signals are used to implement a communication protocol between the SSM 203 and the DPRIO frame generator 205.

The DPRIO frame generator 205 is defined to receive a "mdio_addr[7:0]" signal from the MSM 201 to identify the particular address within the DPRIO 109 which is to be accessed to set the voltage at the LF or HF comparator input in order to perform the voltage offset cancellation process. The DPRIO frame generator 205 is also defined to receive the "quad_addr[5:0]" and "mdio_out" signals as inputs. The DPRIO frame generator 205 is further defined to communicate the "mdio_in_ip" "mdio_dis_ip" and "shift_load_ip" signals to the output bypass mux 207.

Figure 3A:
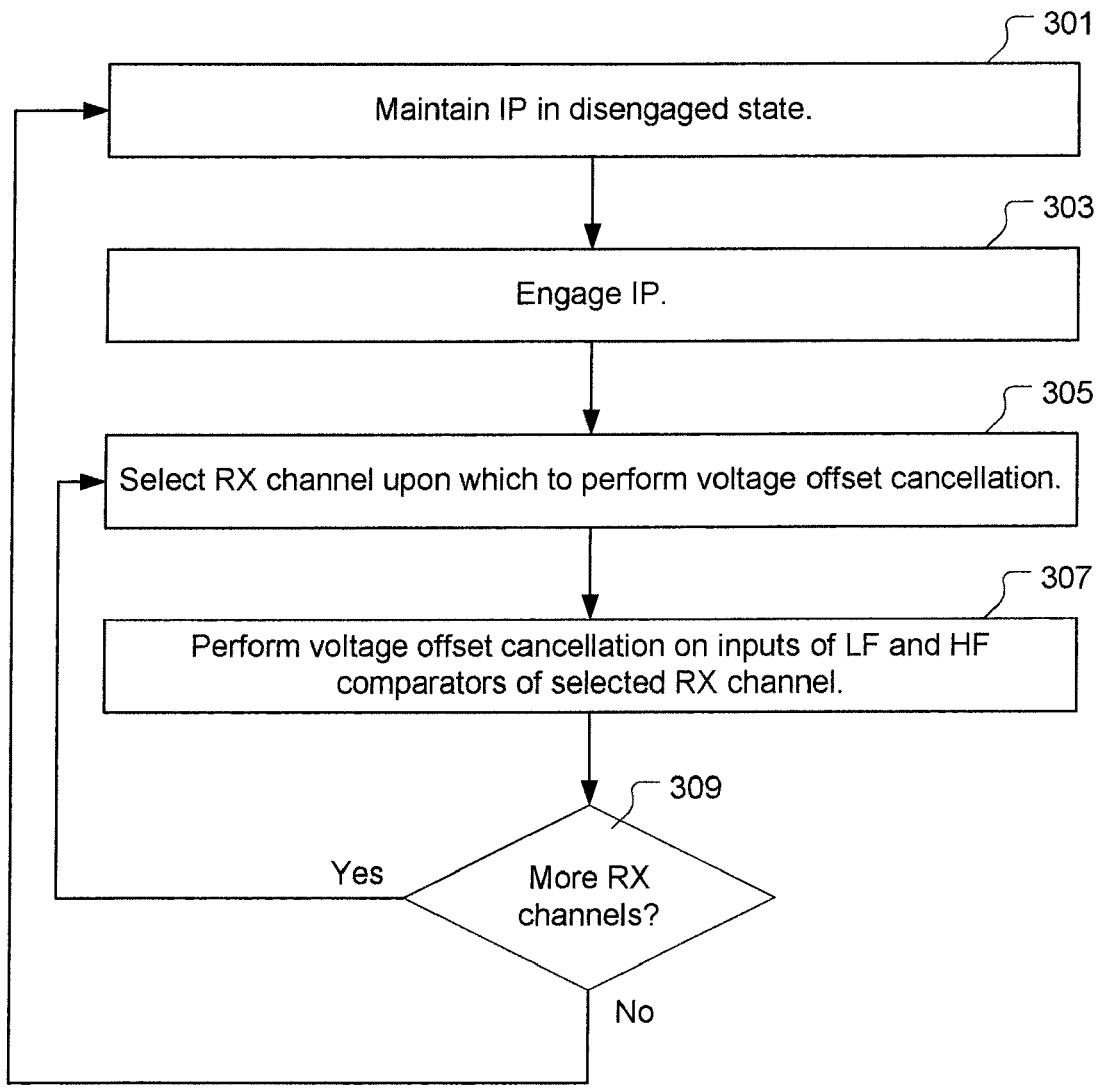
FIG. 3A is an illustration showing a flowchart of a method for performing a ADCE voltage offset cancellation process, in accordance with one embodiment of the present invention.

FIG. 3A is an illustration showing a flowchart of a method for performing a ADCE voltage offset cancellation process, in accordance with one embodiment of the present invention. The method of FIG. 3A is described within the context of the IP 101, as previously discussed with regard to FIGS. 1A, 1B, and 2. The method includes an operation 301 for maintaining the IP 101 is a disengaged state, i.e., in a reset state. In the disengaged state, the IP is not operational and the "ip_start" signal is not asserted. Therefore, with the IP 101 in the disengaged state, the "urx_pdb_pld[3:0]," "mdio_dis_pld," and "shift_load_pld" signals pass through the output bypass mux 207 as if the IP 101 were not present. Also, with the IP 101 in the disengaged state, the MSM 201 and SSM 203 are in a reset state.

From the operation 301, the method proceeds with an operation 303 in which the IP 101 is engaged. In one embodiment, the IP 101 is engaged when the PLD transitions from programming mode into user mode and the "recal" signal is asserted. In another embodiment, the IP 101 is engaged when the PLD is powered up and the "gpll_lock" signal is first asserted. The MSM 201 monitors the "recal" and "gpll_lock" signals. When either the "recal" signal is asserted or the "gpll_lock" signal is first asserted, the MSM 201 and SSM 203 are released from their reset state, and the MSM 201 causes the "ip_start" signal to be asserted, thus engaging the IP 101. Assertion of the "ip_start" signal causes the output bypass mux 207 to transition from listening to the PLD core 103 signals ("urx_pdb_pld[3:0]," "mdio_in_pld," "mdio_dis_pld," "shift_load_pld") to listening to the IP 101 internally generated signals ("urx_pdb_ip[3:0]," "mdio_in_ip," "mdio_dis_ip," "shift_load_ip"). Thus, when the IP 101 is engaged, the IP 101 takes over the DPRIO 109 interface which enables the IP 101 to control the relevant configuration bits that reside within in the DPRIO 109 registers. Additionally, it should be understood that the RX channels are disabled whenever the IP 101 is engaged.

From the operation 303, the method proceeds with an operation 305 for selecting one of the RX channels to be subjected to the voltage offset cancellation process. More specifically, the "ch[3:0]_used" signal received by the MSM 201 is set to identify one or more RX channels to be used. The one or more RX channels identified by the "ch[3:0]_used" signal are the RX channels upon which the voltage offset cancellation process is to be performed. The MSM 201 ensures that the voltage offset cancellation process is performed on each of the identified RX channels. In the operation 305, the MSM 201 selects a particular one of the one or more RX channels identified by the "ch[3:0]_used" signal. To perform the voltage offset cancellation process on the particular channel, the MSM 201 communicates the particular channel identity to the SSM 203. The SSM 203 in turn sets the "updnn_mux_sel[1:0]" signal such that the LF and HF comparator outputs for the particular channel are transmitted from the channel select mux 209 to the SSM 203.

From the operation 305, the method proceeds with an operation 307 in which the voltage offset cancellation process is performed on the inputs of the LF and HF comparators associated with the RX channel selected in operation 305. Operation 307 is described in detail with regard to FIG. 3B.

From operation 307, the method proceeds with an operation 309 for determining whether another RX channel is to be subjected to the voltage offset cancellation process. If another RX channel is to be used (based on the value of the "ch[3:0]_used" signal) and has not yet been subjected to the voltage offset cancellation process, the method proceeds from operation 309 back to operation 305 to select the next RX channel upon which to perform the voltage offset cancellation. If no more RX channels require the voltage offset cancellation process, the method proceeds from operation 309 back to operation 301.

Upon arriving back at operation 301, the MSM 201 and SSM 203 enter their reset state, the "ip_start" signal is unasserted, the output bypass mux 207 is set to pass through the PLD core 103 signals ("urx_pdb_pld[3:0]," "mdio_dis_pld," "shift_load_pld"), and the IP 101 is disengaged. As previously discussed with regard to operation 301, the IP 101 remains disengaged until a rising edge is present on the "recal" signal. The rising edge of the "recal" signal indicates the user's intent to re-calibrate the voltage offset settings that are applied to the LF and HF comparator inputs of the used RX channels. Upon detecting the rising edge of the "recal" signal, the method of FIG. 3A is repeated. It should be appreciated that after the voltage offset cancellation is completed, control of the HSSI 105 is relinquished back to the PLD core 103, and the ADCE reverts back to its normal function of monitoring the output of the RX input buffer and adaptively adjusting the equalization level to give the best performance for the particular backplane, i.e., PCB.

Figure 3B:
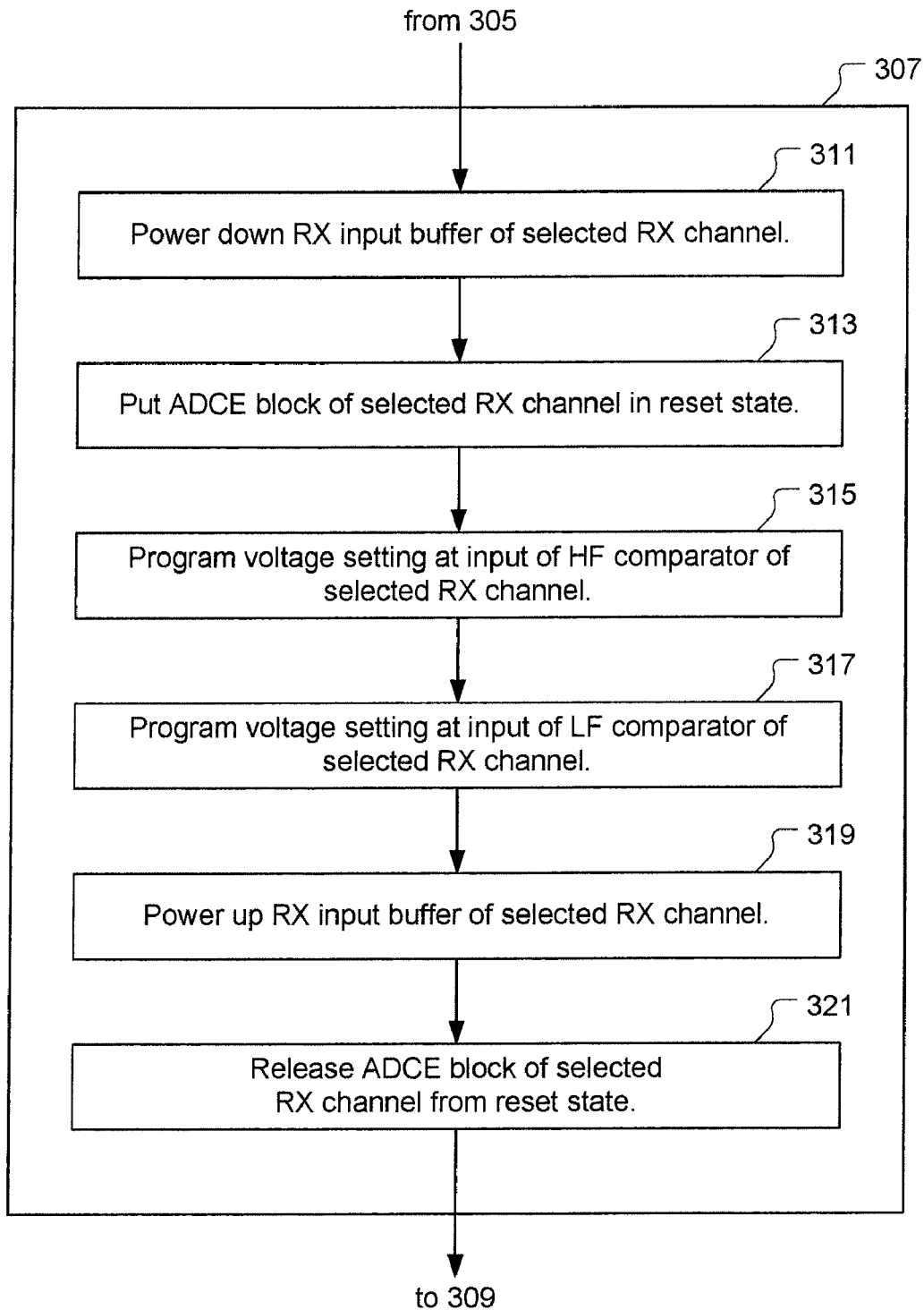
FIG. 3B is an illustration showing a flowchart of a method for performing the voltage offset cancellation process on the inputs of the LF and HF comparators, in accordance with one embodiment of the present invention.

FIG. 3B is an illustration showing a flowchart of a method for performing the voltage offset cancellation process on the inputs of the LF and HF comparators, in accordance with one embodiment of the present invention. It should be understood that the method of FIG. 3B corresponds to the operation 307 in the method of FIG. 3A. The method includes an operation 311 in which the IP 101 powers down the RX input buffer of the RX channel selected in operation 305. For ease of description, the RX channel selected in operation 305 is referred to as channel N. With reference to FIG. 2, the RX input buffer of channel N is powered down by asserting the "urx_pdb_ip[3:0]" signal with channel N corresponding to one of the bits [3:0].

From the operation 311, the method proceeds with an operation 313 for putting the ADCE block associated with channel N in a reset state. To put the ADCE block associated with channel N in its reset state, the IP 101 operates to assert the "adce_rstb[3:0]" signal for the bit [3:0] corresponding to channel N. As previously discussed with regard to FIG. 1A, the "adce_rstb[3:0]" signal is communicated from the DPRIO 109 to the PMA 107. Thus, through the DPRIO frame generator 205, the IP 101 is defined to dynamically program the bits that defined the "adce_rstb[3:0]" signal.

From the operation 313, the method proceeds with an operation 315 for dynamically programming successive voltage settings for the HF comparator input of channel N so as to identify the appropriate voltage offset setting. The voltage setting at the input of the HF comparator is programmed by setting configuration bits which define the "rhf_os[3:0]_CHn" signal communicated from the DPRIO 109 to the PMA 107, as previously discussed with regard to FIGS. 1A and 1B. As the voltage setting at the input of the HF comparator is successively changed, the HF comparator output is monitored by the SSM 203 through the signal "updn-n_hf." The optimum voltage offset setting for the HF comparator input occurs when the state "updnn_hf" signal transitions. Upon transition of the HF comparator output signal, the currently programmed voltage setting at the input of the HF comparator is retained. If the HF comparator output signal "updnn_hf" transitions, the method proceeds from operation 315 to operation 317. However, if the end of the HF comparator input voltage adjustment range is reached without transition of the HF comparator output signal "updnn_hf," the "ch[3:0]_hf_not_found" signal is asserted for channel N. Then, the method proceeds to operation 317.

Operation 317 dynamically programs successive voltage settings for the LF comparator input of channel N so as to identify the appropriate voltage offset setting. The voltage setting at the input of the LF comparator is programmed by setting configuration bits which define the "rlf_os[3:0]_CHn" signal communicated from the DPRIO 109 to the PMA 107, as previously discussed with regard to FIGS. 1A and 1B. As the voltage setting at the input of the LF comparator is successively changed, the LF comparator output is monitored by the SSM 203 through the signal "updnn_lf." The optimum voltage offset setting for the LF comparator input occurs when the state "updnn_lf" signal transitions. Upon transition of the LF comparator output signal, the currently programmed voltage setting at the input of the LF comparator is retained. If the LF comparator output signal "updnn_lf" transitions, the method proceeds from operation 317 to operation 319. However, if the end of the LF comparator input voltage adjustment range is reached without transition of the LF comparator output signal "updnn_lf," the "ch[3:0]_lf_not_found" signal is asserted for channel N. Then, the method proceeds to operation 319.

The dynamic programming of operations 315 and 317 is described in more detail below with regard to FIG. 3C. In operation 319, the IP 101 powers up the RX input buffer of channel N. With reference to FIG. 2, the RX input buffer of channel N is powered up by operating the MSM 201 to de-assert the "urx_pdb_ip[3:0]" signal with channel N corresponding to one of the bits [3:0]. From operation 319, the method proceeds with an operation 321 for releasing the ADCE block associated with channel N from the reset state. To release the ADCE block associated with channel N from its reset state, the IP 101 operates to de-assert the "adce_rstb [3:0]" signal for the bit [3:0] corresponding to channel N.

Figure 3C:
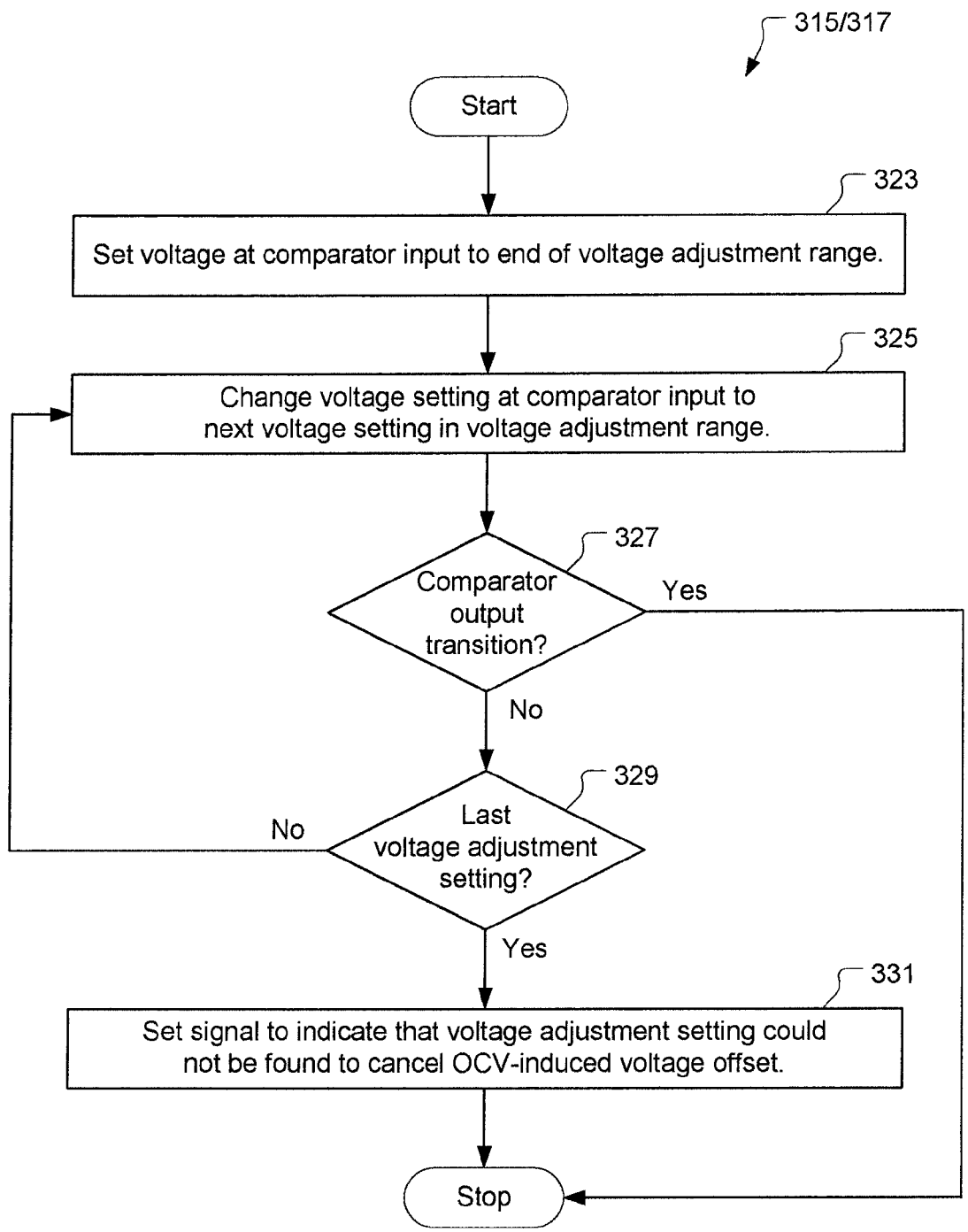
FIG. 3C is an illustration showing a flowchart of a method for programming the voltage setting at the input of LF and HF comparators, in accordance with one embodiment of the present invention.

FIG. 3C is an illustration showing a flowchart of a method for programming the voltage setting at the input of LF and HF comparators, as performed in operations 315 and 317, in accordance with one embodiment of the present invention. For ease of discussion, the term "comparator" as used with regard to FIG. 3C can represent either an LF comparator or an HF comparator of a RX channel. In an operation 323, the voltage at one of the two differential inputs of the comparator is set to one end of the available voltage adjustment range. The number of voltage increments in the voltage adjustment range is defined by the number of bits used to identify a particular voltage setting within the voltage adjustment range. For example, if the voltage adjustment settings are stored in a lookup table that is indexed by a 4 bit value, the lookup table can include $2^4$ or 16 voltage setting entries. In one exemplary embodiment, the lookup table is defined to span a voltage adjustment range extending from −70 mV to +70 mV, in 10 mV increments. In this example, a 4 bit lookup table index is capable of accessing each of the 15 entries in the lookup table. It should be understood, however, that in other embodiments the voltage adjustment range and voltage increments therein can be defined in essentially any manner necessary to satisfy the voltage offset needs at the inputs of the LF and HF comparators.

When the voltage at the input of the comparator is changed from its default setting to one end of the available voltage adjustment range, the state of the comparator output signal (updnn_hf or updnn_hf) transitions. This initial transition of the comparator output signal is ignored by the IP 101. The method continues with an operation 325 in which the voltage setting at the input of the comparator is changed to the next setting in the voltage adjustment range. If the voltage at the comparator input was initially set to the low end of the voltage adjustment range, operation 325 will change the voltage setting to the next highest voltage in the voltage adjustment range. If the voltage at the comparator input was initially set to the high end of the voltage adjustment range, operation 325 will change the voltage setting to the next lowest voltage in the voltage adjustment range.

Following operation 325, an operation 327 is performed to determine whether the state of the comparator output signal transitioned in response to the change of voltage setting in operation 325. When a voltage applied to the input of the comparator successfully cancels out the OCV-induced voltage offset between the two differential inputs of the comparator, the state of the comparator output signal will transition. If the comparator output signal transitioned in response to the voltage setting of operation 325, programming of the voltage setting at the comparator input is completed. The particular comparator input voltage setting that caused the transition of the comparator output signal is retained in the DPRIO.

If the comparator output signal did not transition in response to the voltage setting of operation 325, the method proceeds with an operation 329 to determine if the last voltage adjustment setting of operation 325 corresponds to the end of the voltage adjustment range opposite the initial voltage adjustment setting. Thus, operation 329 determines whether the entire voltage adjustment range has been traversed. If the last voltage adjustment setting of operation 325 does not correspond to the end of the voltage adjustment range opposite the initial voltage adjustment setting, the method reverts back to continue with operation 325.

If the last voltage adjustment setting of operation 325 does correspond to the end of the voltage adjustment range opposite the initial voltage adjustment setting, the method proceeds to an operation 331 for generating a signal to indicate that a voltage adjustment setting could not be found to cancel the OCV-induced voltage offset present at the comparator input. With reference to FIG. 2, the "ch[3:0]lf_not_found" and "ch[3:0]_hf_not_found" signals are used to indicate that a voltage adjustment setting could not be found to cancel the OCV-induced voltage offset present at the input of a particular LF or HF comparator.

It should be appreciated that the programming method of FIG. 3C implements a linear search as opposed to a binary search. Therefore, following the initial voltage adjustment setting change, the IP 101 is expected to encounter only one transition edge of the comparator output signal as it sweeps through the successive voltage adjustment settings. The SSM 203 will detect that transition edge and store the corresponding comparator input voltage setting as the permanent setting, then move on to the next comparator or channel. In accordance with the foregoing, it should be appreciated that the IP 101 logic, specifically the SSM 203 logic, does not need to detect multiple edges and determine which of the multiple edges corresponds to the most appropriate voltage adjustment setting. Therefore, the method for programming the voltage setting at the input of LF and HF comparators reduces the complexity of the IP 101 design and consequently the number of logic elements used in the PLD core 103 to implement the IP 101.

As discussed herein, the IP 101 is automatically engaged upon chip power up, or upon reception of a user initiated recalibration signal. Upon engagement, the IP 101 temporarily takes over the DPRIO 109 controls within the HSSI 105. The IP 101 monitors the LF and HF comparator outputs with the RX input buffer in a powered down state. The IP 101 searches for and programs, via the DPRIO 109 interface, the optimal LF and HF comparator input voltage adjustment setting based on detection of a transition in the LF and HF comparator output signals. Control of the DPRIO 109 is relinquished back to the user upon completion of the IP 101 operations.

It should be understood that the ADCE's responsibility is to equalize the impedance between the PLD and its backplane. The IP 101 is used to correct for OCV-induced voltage offset at the inputs of the LF and HF comparators in the RX channels so that the ADCE can do its job properly. In other words, the IP 101 automates the characterization of the PLD for the user's particular backplane with regard to setting the variable current sources connected to the input terminals of the LF and HF comparators so as to offset any standby voltage differential that may be present between the terminals of a respective LF or HF comparator. The IP 101 also provides the ability to re-calibrate the settings of the variable current sources connected to the inputs of the LF and HF comparators associated with the RX channels.

In one embodiment, the present invention makes use of the dynamic reconfiguration capability of Stratix-II GX FPGA as well as the pre-placed configuration-controlled programmable voltage offset cancellation circuitry on the ADCE's LF and HF comparator inputs. The IP 101 utilizes pre-existing signals available from the HSSI 105, namely the "updnn_hf," "updnn_hf," and DPRIO 109 control and clock signals, thereby ensuring seamless integration of the IP 101 into the Stratix-II GX FPGA. In one embodiment, the IP 101 can be represented as a verilog block that can be used to program the PLD. For example, in one embodiment, the present invention can be incorporated within the "alt2gxb_reconfig" wrapper created by the Quartus software provided by Altera Corporation. It should be understood, however, that the IP 101 is ultimately implemented as circuitry on the programmed PLD.

The method and apparatus for OCV-induced voltage offset cancellation as disclosed herein may be part of a data processing system that includes one or more of the following components: a processor; memory, I/O circuitry, and peripheral devices. The data processing system can be used in a wide variety of applications, such as computer networking, data networking, instrumentation, video processing, digital signal processing, or any other suitable application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for standby voltage offset cancellation at inputs to a comparator within a receiver channel, comprising:
   operating a master state machine to power down an input buffer of the receiver channel so as to isolate a first input of a high-frequency comparator from a first high-frequency input signal, and so as to isolate a second input of the high-frequency comparator from a second high-frequency input signal, and so as to isolate a first input of a low-frequency comparator from a first low-frequency input signal, and so as to isolate a second input of the low-frequency comparator from a second low-frequency input signal, such that each of the first and second inputs of the high-frequency comparator and each of the first and second inputs of the low-frequency comparator attains a respective standby voltage level;

operating a search state machine to monitor an output signal of the high-frequency comparator and an output signal of the low-frequency comparator;

operating the search state machine to program incremental increases in a voltage level on one of the first and second inputs of the high-frequency comparator from a low voltage end of a voltage adjustment range toward a high voltage end of the voltage adjustment range;

upon detecting a state transition in the output signal of the high-frequency comparator via the monitoring by the search state machine, operating the search state machine to stop programming the incremental increases in the voltage level on the one high-frequency comparator input such that a final voltage level programmed by the search state machine is retained on the one high-frequency comparator input;

operating the search state machine to program incremental increases in a voltage level on one of the first and second inputs of the low-frequency comparator from the low voltage end of the voltage adjustment range toward the high voltage end of the voltage adjustment range; and upon detecting a state transition in the output signal of the low-frequency comparator via the monitoring by the search state machine, operating the search state machine to stop programming the incremental increases in the voltage level on the one low-frequency comparator input such that a final voltage level programmed by the search state machine is retained on the one low-frequency comparator input.

2. A method as recited in claim 1, wherein a difference between the respective standby voltages attained by the first and second inputs of the high-frequency comparator reflects a high-frequency comparator voltage offset caused by on-chip variation within a chip in which the receiver channel is disposed, and wherein a difference between the respective standby voltages attained by the first and second inputs of the low-frequency comparator reflects a low-frequency comparator voltage offset caused by on-chip variation within the chip in which the receiver channel is disposed.

3. A method as recited in claim 1, wherein the voltage adjustment range is defined by a fixed number of equally spaced voltage levels centered about a voltage level of zero.

4. A method as recited in claim 1, wherein incrementally changing the voltage level on the one high-frequency comparator input is performed by operating the search state machine to program a setting of a first variable current source connected to the one high-frequency comparator input, and wherein incrementally changing the voltage level on the one low-frequency comparator input is performed by operating the search state machine to program a setting of a second variable current source connected to the one low-frequency comparator input.

5. A method as recited in claim 1, wherein the final voltage level programmed by the search state machine on the one high-frequency comparator input substantially cancels a standby voltage differential between the first and second inputs of the high-frequency comparator, and wherein the final voltage level programmed by the search state machine on the one low-frequency comparator input substantially cancels a standby voltage differential between the first and second inputs of the low-frequency comparator.

6. A method as recited in claim 1, further comprising:

upon operating the search state machine to program a last voltage level at the high voltage end of the voltage adjustment range on the one high-frequency comparator input and detecting no state transition in the output signal of the high-frequency comparator, operating the search state machine to transmit a signal to the master state machine indicating that the standby voltage offset compensation setting for the high-frequency comparator could not be found, and upon operating the search state machine to program a last voltage level at the high voltage end of the voltage adjustment range on the one high-frequency comparator input and detecting no state transition in the output signal of the high-frequency comparator, operating the search state machine to transmit a signal to the master state machine indicating that the standby voltage offset compensation setting for the high-frequency comparator could not be found.

7. A method as recited in claim 1, wherein prior to operating the master state machine to power down the input buffer of the receiver channel, the first high-frequency input signal is transmitted to the first high-frequency comparator input from an output of a first high-pass filter, the first high-pass filter having an input connected to an output of an equalizer, the equalizer having an input connected to an output of the input buffer of the receiver channel, and wherein prior to operating the master state machine to power down the input buffer of the receiver channel, the second high-frequency input signal is transmitted to the second high-frequency comparator input from an output of a second high-pass filter having an input connected to an output of a reference edge generator, the reference edge generator having an input connected to the output of the equalizer.

8. A method as recited in claim 7, wherein prior to operating the master state machine to power down the input buffer of the receiver channel, the first low-frequency input signal is transmitted to the first low-frequency comparator input from an output of a first low-pass filter, the first low-pass filter having an input connected to the output of the equalizer, and wherein prior to operating the master state machine to power down the input buffer of the receiver channel, the second low-frequency input signal is transmitted to the second low-frequency comparator input from an output of a second low-pass filter, the second low-pass filter having an input connected to the output of the reference edge generator.

9. A method as recited in claim 1, further comprising:

upon operating the search state machine to stop programming the incremental increases in the voltage level on the one high-frequency comparator input and in the voltage level on the one low-frequency comparator input, operating the master state machine to automatically power up the input buffer of the receiver channel.

10. A method as recited in claim 1, wherein the master state machine and the search state machine are defined within a programmable module of a field programmable gate array (FPGA).

11. A module for determining and programming standby voltage offset cancellation settings for a comparator within a receiver channel, comprising:

a master state machine defined to power down an input buffer of the receiver channel so as to isolate a first input of a high-frequency comparator from a first high-frequency input signal, and so as to isolate a second input of the high-frequency comparator from a second high-frequency input signal, and so as to isolate a first input of a low-frequency comparator from a first low-frequency input signal, and so as to isolate a second input of the low-frequency comparator from a second low-frequency input signal, such that each of the first and second inputs of the high-frequency comparator and each of the first and second inputs of the low-frequency comparator attains a respective standby voltage level;

a first programmable variable current source connected to one of the first and second inputs of the high-frequency comparator;

a second programmable variable current source connected to one of the first and second inputs of the low-frequency comparator; and a search state machine defined to monitor an output signal of the high-frequency comparator, the search state machine defined to program the first programmable variable current source so as to incrementally increase a voltage level on the one high-frequency comparator input to which the first programmable variable current source is connected, from a low voltage end of a voltage adjustment range toward a high voltage end of the voltage adjustment range, the search state machine defined to detect a state transition in the output signal of the high-frequency comparator and responsively stop programming the first programmable variable current source, such that a final voltage level on the one high-frequency comparator input is programmed into the first programmable variable current source, the search state machine defined to monitor an output signal of the low-frequency comparator, the search state machine defined to program the second programmable variable current source so as to incrementally increase a voltage level on the one low-frequency comparator input to which the second programmable variable current source is connected, from the low voltage end of the voltage adjustment range toward the high voltage end of the voltage adjustment range, the search state machine defined to detect a state transition in the output signal of the low-frequency comparator and responsively stop programming the second programmable variable current source, such that a final voltage level on the one low-frequency comparator input is programmed into the second programmable variable current source.

12. A module as recited in claim 11, wherein the final voltage level on the one high-frequency comparator input substantially cancels a standby voltage differential between the first and second inputs of the high-frequency comparator, and wherein the final voltage level on the one low-frequency comparator input substantially cancels a standby voltage differential between the first and second inputs of the low-frequency comparator.

13. A module as recited in claim 11, wherein the module is defined within a programmable logic device (PLD), and wherein the master state machine and search state machine are defined to operate automatically upon power up of the PLD to provide for automatic cancellation of both a standby voltage differential present at the first and second inputs of the high-frequency comparator and a standby voltage differential present at the first and second inputs of the low-frequency comparator within the receiver channel.

14. A module as recited in claim 11, wherein the voltage adjustment range is defined by a fixed number of equally spaced voltage levels centered about a voltage level of zero.

15. A module as recited in claim 11, wherein the search state machine is defined to transmit a signal to the master state machine indicating that the standby voltage offset compensation setting for the high-frequency comparator could not be found, upon both programming a last voltage level at the high voltage end of the voltage adjustment range into the first programmable variable current source and detecting no state transition in the output signal of the high-frequency comparator, and wherein the search state machine is defined to transmit a signal to the master state machine indicating that the standby voltage offset compensation setting for the low-frequency comparator could not be found, upon both programming a last voltage level at the high voltage end of the voltage adjustment range into the second programmable variable current source and detecting no state transition in the output signal of the low-frequency comparator.

16. A module as recited in claim 11, wherein the first input of the high-frequency comparator is connected an output of a first high-pass filter, the first high-pass filter having an input connected to an output of an equalizer, the equalizer having an input connected to an output of the input buffer of the receiver channel, and wherein the second input of the high-frequency comparator is connected to an output of a second high-pass filter having an input connected to an output of a reference edge generator, the reference edge generator having an input connected to the output of the equalizer.

17. A module as recited in claim 16, wherein the first input of the low-frequency comparator is connected to an output of a first low-pass filter, the first low-pass filter having an input connected to the output of the equalizer, and wherein the second input of the low-frequency comparator is connected to an output of a second low-pass filter, the second low-pass filter having an input connected to the output of the reference edge generator.

18. A module as recited in claim 11, wherein the master state machine is defined to automatically power up the input buffer of the receiver channel when the search state machine stops programming the incremental increases in the voltage level on the one high-frequency comparator input and in the voltage level on the one low-frequency comparator input.

* * * * *